US006784712B2

(12) United States Patent
Hemmi

(10) Patent No.: US 6,784,712 B2
(45) Date of Patent: Aug. 31, 2004

(54) VARIABLE CIRCUIT CAPABLE OF CHANGING THE CONNECTED STATES OF ITS FLIPFLOPS

(75) Inventor: Hitoshi Hemmi, Seika-cho (JP)

(73) Assignee: Advanced Telecommunications Research Institute International, Kyoto (JP)

( * ) Notice: Subject to any disclaimer, the term of this patent is extended or adjusted under 35 U.S.C. 154(b) by 0 days.

(21) Appl. No.: 10/372,701

(22) Filed: Feb. 21, 2003

(65) Prior Publication Data

US 2003/0160643 A1 Aug. 28, 2003

(30) Foreign Application Priority Data

Feb. 22, 2002 (JP) ........................................ 2002-046735

(51) Int. Cl.[7] ........................... H03K 3/037; H03K 3/12; H03K 3/286

(52) U.S. Cl. ........................................ 327/199; 327/216
(58) Field of Search .................................. 327/199, 216, 327/200; 377/43, 54, 109, 119

(56) References Cited

U.S. PATENT DOCUMENTS

| | | | | | |
|---|---|---|---|---|---|
| 3,571,573 A | * | 3/1971 | Ott | ............................... | 377/56 |
| 3,980,820 A | * | 9/1976 | Niemi et al. | ................. | 375/373 |
| 4,489,279 A | * | 12/1984 | Kuroki | ........................ | 327/101 |
| 4,951,301 A | * | 8/1990 | Zulian | .......................... | 377/54 |

* cited by examiner

*Primary Examiner*—Tuan T. Lam
(74) *Attorney, Agent, or Firm*—Squire, Sanders & Dempsey L.L.P.

(57) ABSTRACT

A variable circuit for constructing a desired counter by changing the circuit configuration of the connection status of a plurality of flipflops. The flipflops may be arranged in first and second rows, or stages, whereby the flipflops of the first and second rows are interconnected.

9 Claims, 5 Drawing Sheets

VARIABLE CIRCUIT CAPABLE OF CHANGING THE CONNECTED STATES OF ITS FLIPFLOPS

BACKGROUND OF THE INVENTION AND RELATED ART STATEMENT

Field of the Invention

The present invention relates to a variable circuit for changing a circuit configuration by changing connected states of a plurality of flipflops.

Conventionally, various counter circuits have been used upon designing a digital circuit for specified counting operations and the like. For example, a Johnson counter for counting by (2n)s by feeding an output of the final stage of a n-bit shift register to the first stage while inverting it is used. This Johnson counter differs from usual ring counters in that a loop returning from the final stage to the first stage is twisted, and (2n) count patterns are created in the case of using the n-bit shift register. Thus, the Johnson counter can be configured by half the number of flipflops as compared to the ring counters and has an advantage that counting can be speeded up since each flipflop has a time margin of n clocks upon changing its state from 0→1→0.

However, in the above conventional Johnson counter, a circuit configuration such as the number of stages of shift registers is determined beforehand so as to realize a desired counting operation and the like. Once the Johnson counter is manufactured, the circuit configuration cannot be changed by changing the connected states of the respective flipflops. Therefore, the configuration of the Johnson counter could not be suitably changed.

SUMMARY OF THE INVENTION

An object of the present invention is to provide a variable circuit enabling a desired Johnson counter to be easily configured by changing a circuit configuration after the circuit is manufactured.

The variable circuit according to an aspect of the present invention is a variable circuit for changing a circuit configuration by changing connected states of a plurality of flipflops, wherein the plurality of flipflops are arranged in a first and a second rows, and in the case that the flipflops in the first and second rows are alternately arranged, an input side of each flipflop arranged in the first row has a connection selected from a twisted connection with an output side thereof, a straight connection with an output side of the flipflop provided before this flipflop in the first row, and twisted connections with output sides of two flipflops arranged in the second row and adjacent to this flipflop, and an input side of each flipflop arranged in the second row has a connection selected from a twisted connection with an output side thereof, a straight connection with an output side of the flipflop provided before this flipflop in the second row, and straight connections with output sides of two flipflops arranged in the first row and adjacent to this flipflop.

In the variable circuit thus configured, ring counters of a desired number of stages can be configured by connecting one or a plurality of flipflops in loop, and a loop can be formed by the twisted connection only at one stage of each ring counter. Thus, a desired Johnson counter can be easily configured by changing the circuit configuration after the variable circuit is configured.

Preferably, Johnson counters constructed by the plurality of flipflops include a Johnson counter provided with a stop-motion control for stopping the state transition thereof.

In such a case, since the Johnson counter can execute a normal state transition and stop in a desired state by having the stop-motion control, various state transitions can be realized.

Preferably, the Johnson counter provided with the stop-motion control includes a first and a second Johnson counters, and a decoded output of the first Johnson counter is used as a stop-motion control signal for controlling the stop motion of the second Johnson counter.

In such a case, a certain state of the first Johnson counter can kick the second Johnson counter to transition the state of the second Johnson counter to a desired one, and a desired state transition can be realized by combining a plurality of Johnson counters.

These and other objects, features and advantages of the present invention will become more apparent upon reading the following detailed description along with the accompanying drawings.

DETAILED DESCRIPTION OF THE PREFERRED EMBODIMENTS OF THE INVENTION

Figure 1:
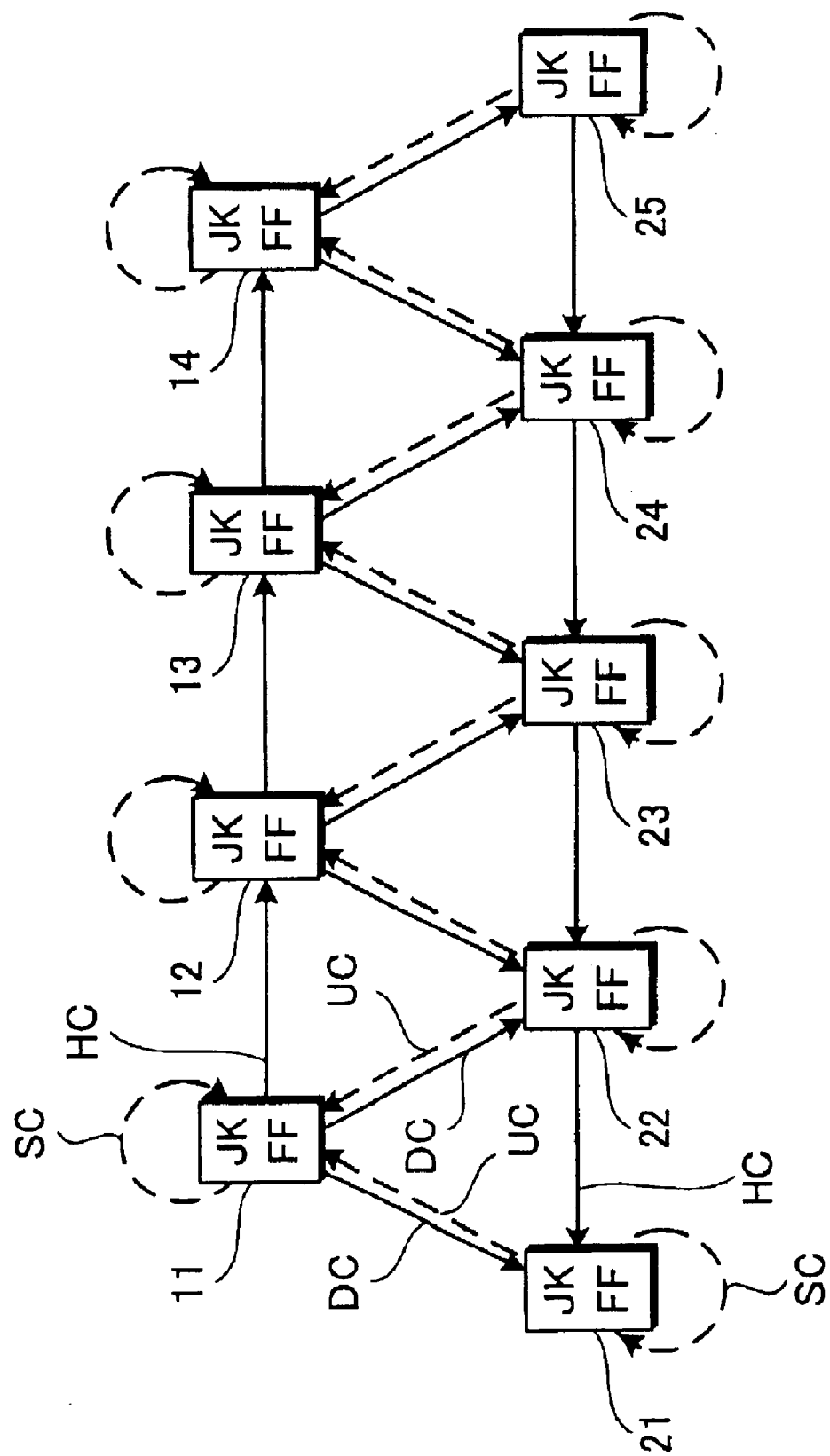
FIG. 1 is a circuit diagram diagrammatically showing a configuration of a variable circuit according to a first embodiment of the invention.

Hereinafter, variable circuits according to embodiments of the present invention are described with reference to the accompanying drawings. FIG. 1 is a circuit diagram diagrammatically showing a configuration of a variable circuit according to a first embodiment of the invention.

The variable circuit shown in FIG. 1 includes a plurality of JK flipflop units 11 to 14, 21 to 25. Four JK flipflop units aligned in a line at an upper stage, whereas five JK flipflop units 21 to 25 are aligned in a line at a lower stage. Further, each JK flipflop units 11 to 14 at the upper stage is arranged between a corresponding pair of the JK flipflop units 21 to 25 at the lower stages, so that the JK flipflop units 11 to 14, 21 to 25 are alternately arranged in two lines. The JK flipflop units 11 to 14, 21 to 25 are connected in truss.

An input side of each JK flipflop units 11 to 14 at the upper stage is so constructed as to basically selectively take any one of a twisted connection with an output side thereof by a self-loop connection path SC, a straight connection with an output side of one of the JK flipflop units 11 to 14 at the upper stage arranged before (left side in FIG. 1) this JK flipflop unit by a horizontal-loop connection path HC, and twisted connections with output sides of two of the JK flipflop units 21 to 25 at the lower stage arranged adjacent to this JK flipflop unit by up-loop connection paths UC. It should be noted that no connection is made between the JK flipflop unit 11 with the output side of the flipflop unit before it by the horizontal-loop connection path HC since no flipflop unit exists before the JK flipflop unit 11.

Further, an input side of each JK flipflop units 21 to 25 at the lower stage is so constructed as to basically selectively take any one of a twisted connection with the output side thereof by the self-loop connection path SC, a straight connection with an output side of one of the JK flipflop units 21 to 25 at the lower stage arranged before. (right side in FIG. 1) this JK flipflop unit by the horizontal-loop connection path HC, and straight connections with output sides of two of the JK flipflop units 11 to 14 at the upper stage arranged adjacent to this JK flipflop unit by down-loop connection paths DC. It should be noted that one of the connections by the down-loop connection paths DC is not made at the JK flipflop unit 21 since one of the flipflop units at the upper stage adjacent to the JK flipflop unit 21 does not exist, and no connection is made between the JK flipflop unit 25 with the output side of the flipflop unit before it by the horizontal connection path HC and between the JK flipflop unit 25 and the output side of one of the flipflop units at the upper stage by the down-loop connection path DC since no flipflop unit exists before the JK flipflop unit 25 and one of the flipflop units at the upper stage adjacent to the JK flipflop unit 25 does not exist.

Figure 2A:
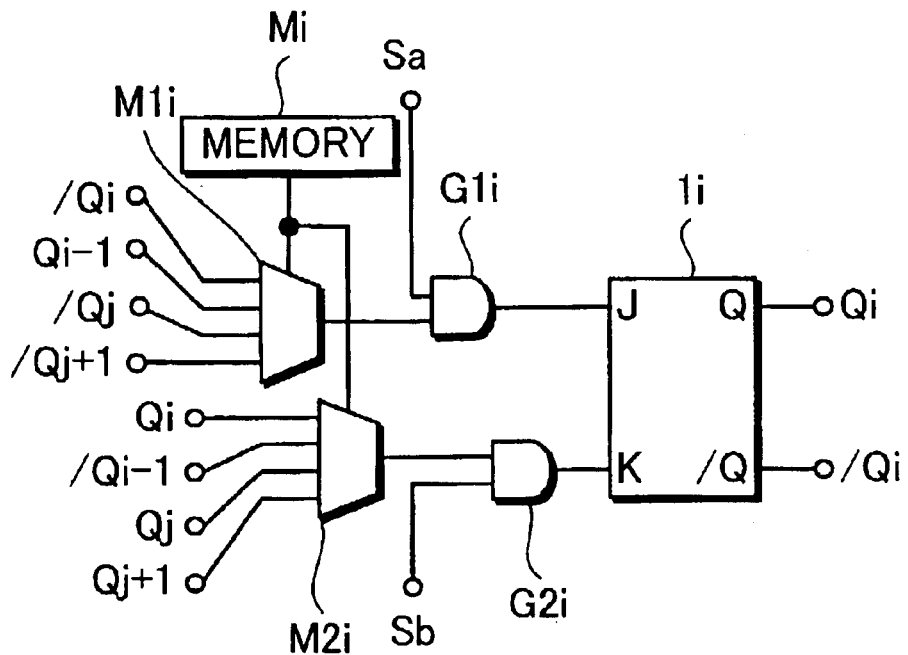
FIGS. 2A and 2B are circuit diagrams showing examples of specific configurations of a JK flipflop unit shown in FIG. 1.
Figure 2B:
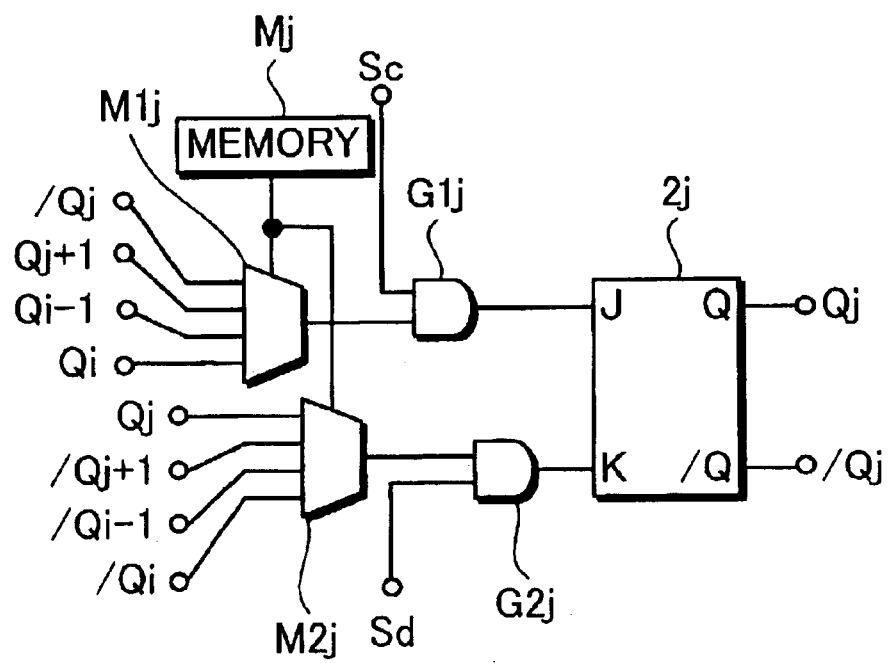

FIGS. 2A and 2B are circuit diagrams showing examples of specific configurations of the JK flipflop unit shown in FIG. 1. FIG. 2A shows a configuration example of the JK flipflop units 11 to 14 at the upper stage, whereas FIG. 2B shows a configuration example of the JK flipflop units 21 to 25 at the lower stage. Although clock terminals and reset terminals are not shown in FIGS. 2A and 2B in order to facilitate the description, it is assumed that specified clock pulse and reset pulse are inputted if necessary.

As shown in FIGS. 2A and 2B, each of the JK flipflop units 11 to 14 at the upper stage includes a JK flipflop $1i$ ($i=1$ to 4), multiplexers M$1i$, M$2i$, AND gates G$1i$, G$2i$ and a memory M$i$, whereas each of the JK flipflop units 21 to 25 at the lower stage includes a JK flipflop $2j$ ($j=1$ to 5), multiplexers M$1j$, M$2j$, AND gates G$1j$, G$2j$ and a memory M$j$.

To the multiplexer M$1i$ are inputted an inverted output /Qi of the JK flipflop $1i$, an output Qi−1 of the JK flipflop $1i$−1 located before the JK flipflop $1i$, an inverted output /Qj of the JK flipflop $2j$ located obliquely down to left from the JK flipflop $1i$, and an inverted output /Qj+1 of the JK flipflop $2j$+1 located obliquely down to right from the JK flipflop $1i$.

The multiplexer M$1i$ inputs one of the four outputs /Qi, Qi−1, /Qj, /Qj+1 to the AND gate G$1i$ in accordance with a 2-bit value of the memory Mi. For example, the output /Qi is selected if the value of the memory Mi is (0, 0); the output Qi−1 is selected if it is (0, 1); the output /Qj is selected if it is (1, 1); and the output /Qj+1 is selected if it is (1, 1).

To the multiplexer M$2i$ are inputted an output Qi of the JK flipflop $1i$, an inverted output /Qi−1 of the JK flipflop $1i$−1, an output Qj of the JK flipflop $2j$, and an output Qj+1 of the JK flipflop $2j$+1. The multiplexer M$2i$ inputs one of the four outputs Qi, /Qi−1, Qj, Qj+1 to the AND gate G$2j$ in accordance with the 2-bit value of the memory Mi.

Stop-motion control signals Sa, Sb, which are inputs for stop motion for creating a stop motion to stop the state transition of the Johnson counter are inputted to the AND gates G$1i$, G$2i$, respectively. The AND gate G$1i$ inputs the output selected by the multiplexer M$1i$ to J-terminal of the JK flipflop $1i$ in accordance with the stop-motion control signal Sa, whereas the AND gate G$2i$ inputs the output selected by the multiplexer M$2i$ to K-terminal of the JK flipflop $1i$ in accordance with the stop-motion control signal Sb. For example, the AND gates G$1i$, G$2i$ cause the Johnson counter to transition its state if the stop-motion control signals Sa, Sb take a value of 1 while causing them to stop transitioning its state if the stop-motion signals take a value of 0.

To the multiplexer M$1j$ are inputted an inverted output /Qj of the JK flipflop $2j$, an output Qi+1 of the JK flipflop $2j$+1 located before the JK flipflop $2j$, an output Q−1 of the JK flipflop $1j$−1 located obliquely up to left from the JK flipflop $2j$, and an output Qi of the JK flipflop $1j$ located obliquely up to right from the JK flipflop $2j$. The multiplexer M$1j$ inputs one of the four outputs /Qj, Qj+1, Qi−1, Qi to the AND gate G$1j$ in accordance with a 2-bit value of the memory Mj.

To the multiplexer M$2j$ are inputted an output Qj of the JK flipflop $2j$, an inverted output /Qj+1 of the JK flipflop $2j$+1, an inverted output /Q−1 of the JK flipflop $1i$−1, and an inverted output /Qi of the JK flipflop $1i$. The multiplexer M$2j$ inputs one of the four outputs Qj, /Qj+1, /Qi−1, /Qi to the AND gate G$2j$ in accordance with the 2-bit value of the memory Mj.

Stop-motion control signals Sc, Sd used to proceed to stop motion for keeping the state of the Johnson counter are inputted to the AND gates G$1j$, G$2j$, respectively. The AND gate G$1j$ inputs the output selected by the multiplexer M$1j$ to J-terminal of the JK flipflop $2j$ in accordance with the stop-motion control signal Sc, whereas the AND gate G$2j$ inputs the output selected by the multiplexer M$2j$ to K-terminal of the JK flipflop $2j$ in accordance with the stop-motion control signal Sd.

The stop-motion control signals Sa to Sd are signals generated from a specified control signal generating circuit (not shown) and are unnecessary when stop motion is not executed. Further, the control of the multiplexers is not particularly limited to the above example using the memories, and an other control circuit may be used for this purpose. Further, the circuit for selecting one output out of four is not particularly limited to the one constructed by the multiplexers and the memories, and an other control circuit may be used.

In the variable circuit of this embodiment having the above configuration, ring counters of a desired number of stages can be configured by connecting one or a plurality of JK flipflops in loop, and a loop can be formed by the twisted connection only at one state in each ring counter. Thus, a desired Johnson counter can be easily configured by changing a circuit configuration after the circuit is manufactured.

For example, in the case that a loop is formed by the self-loop connection path SC in the JK flipflop unit 21, a ring counter of one stage is configured and a loop is formed by the twisted connection only at one stage. Thus, a Johnson counter of one stage can be configured. Further, in the case that the JK flipflop unit 11 and the JK flipflop unit 22 are connected by the down-loop connection path DC and the up-loop connection path UC, a ring counter of two stages is configured and only the up-loop connection path UC is twisted. Thus, a Johnson counter of two stages can be configured. Furthermore, in the case that the JK flipflop unit 12 and the JK flipflop unit 13 are connected by the horizontal-loop connection path HC, the JK flipflop unit 13 and the JK flipflop unit 23 are connected by the down-loop connection path DC, and the JK flipflop unit 23 and the JK flipflop unit 12 are connected by the up-loop connection path UC, a ring counter of three stages is configured and only the up-loop connection path UC is twisted. Thus, a Johnson counter of three stages can be configured.

Figure 3:
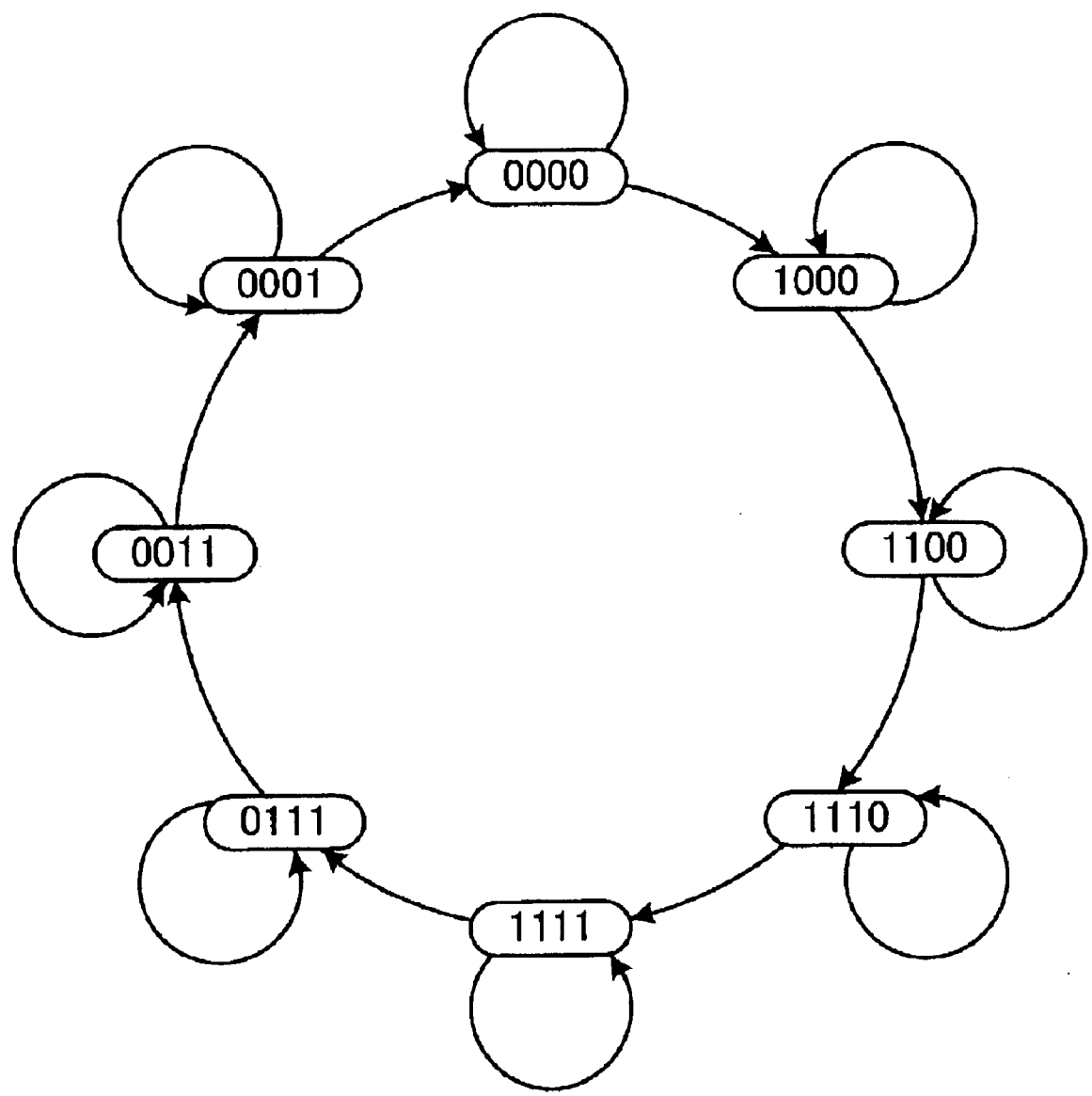
FIG. 3 is a diagram showing a state transition of a Johnson counter of four stages constructed using the variable circuit shown in FIG. 1.

FIG. 3 is a diagram showing a state transition of a Johnson counter of fourth stages configured using the variable circuit shown in FIG. 1. A Johnson counter of four stages can be configured, for example, by connecting the JK flipflop unit 12 and the JK flipflop unit 13 by the horizontal-loop connection path HC, connecting the JK flipflop unit 13 and the JK flipflop unit 23 by the down-loop connection path DC, connecting the JK flipflop unit 23 and the JK flipflop unit 22 by the horizontal-loop connection path HC, and connecting the JK flipflop unit 22 and the JK flipflop unit 12 by the up-loop connection path UC.

This Johnson counter can transition its state in the order of (0,0,0,0)→(1,0,0,0)→(1,1,0,0)→(1,1,1,0)→(1,1,1,1)→(0,1,1,1)→(0,0,1,1)→(0,0,0,1) as shown in FIG. 3 and can keep the respective states by stop motion.

In this embodiment, four JK flipflop units are arranged at the upper stage and five JK flipflop units are arranged at the lower stage. However, the number of the JK flipflop units arranged at the upper and lower stages are not particularly limited to the above example, and may be changed to various values.

Further, although a plurality of JK flipflop units are alternately arranged in two lines in this embodiment, an actual arrangement of the JK flipflop units is not particularly limited to the above example provided that a plurality of JK flipflop units are electrically connected as above. Various changes can be made in the arrangement of the JK flipflop units.

Although the variable circuit is configured using the JK flipflops, etc. in the foregoing embodiment, various changes can be made. For example, the variable circuit may be realized by a FPGA (field programmable gate array), etc. In such a case, the FPGA is not usually provided with JK flipflops, but includes D flipflops. The above variable circuit can be configured by combining the D flipflops, AND gates, OR gates and inverters, etc. to construct JK flipflops.

Figure 4:
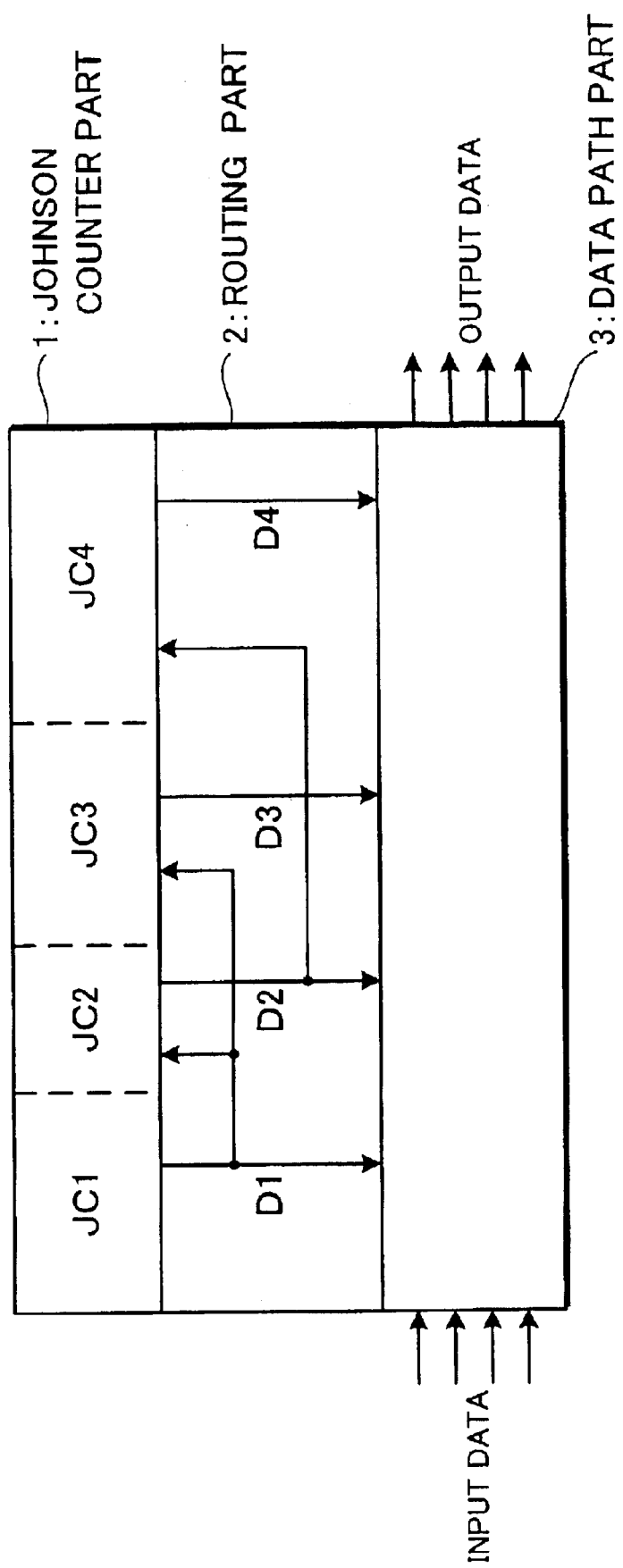
FIG. 4 is a circuit diagram diagrammatically showing a configuration of a variable circuit according to a second embodiment of the invention.

Next, a variable circuit according to a second embodiment of the present invention is described. FIG. 4 is a circuit diagram diagrammatically showing a configuration of the variable circuit according to the second embodiment. The variable circuit shown in FIG. 4 includes a Johnson counter part, a routing part 2 and a data path part 3.

The Johnson counter part 1 is constructed by the variable circuit shown in FIG. 1, a decoding circuit and the like. In this example, four Johnson counters JC1 to JC4 are configured, outputs of the respective Johnson counters JC1 to JC4 are decoded by the decoding circuit to be outputted as decoded outputs D1 to D4. Various decoding circuits may be used as this decoding circuit. For example, inverted outputs obtained by inverting an output of the JK flipflop at the preceding stage and an output of the JK flipflop at the succeeding stage by an inverter are inputted to a 2-input AND gate, and an output of this AND gate is dealt as a decoded output. In this case, a part of the output of the JK flipflop switching from 1 to 0 is outputted as "1".

The routing part 2 is constructed by a space switch. A plurality of wires are arranged in matrix, and switches constructed by time-division gates and latch memories for on-off controlling the time-division gates are arranged at intersections of the respective wires. The routing part 2 switches the connected states of the wires arranged in matrix by turning the respective switches on and off to transmit the decoded outputs D1 to D4 of the Johnson counter JC1 to JC4 to the data path part 3 and to other Johnson counters as a stop-motion control signal.

In an example shown in FIG. 4, the routing part 2 inputs the decoded output D1 of the Johnson counter JC1 as a stop-motion control signal to the Johnson counters JC2, JC3; inputs the decoded output D2 of the Johnson counter JC2 as a stop-motion signal to the Johnson counter JC4, and transmits the decoded outputs D1 to D4 of the Johnson counters JC1 to JC4 to the data path part 3.

The routing part 2 is not particularly limited to the above space switch. An other connection switching circuit may be used provided that the decoded outputs of the Johnson counters are transmitted to the data path part 3 and inputted as the stop-motion control signals to the other Johnson counters.

Figure 5B:
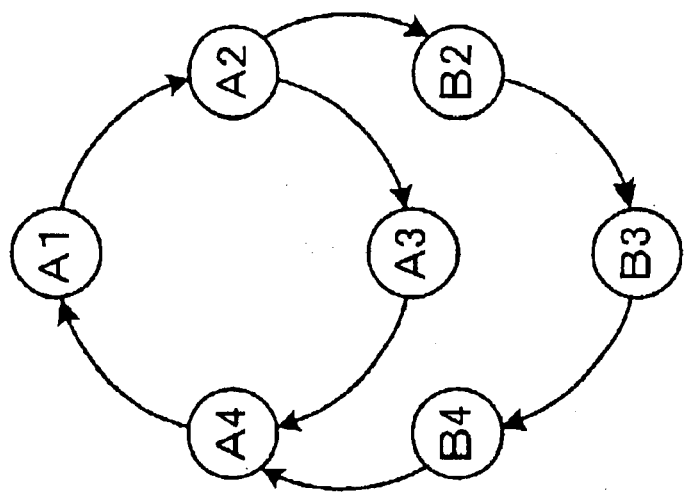
FIGS. 5A and 5B are diagrams showing an exemplary state transition when two Johnson counters are combined.
Figure 5A:
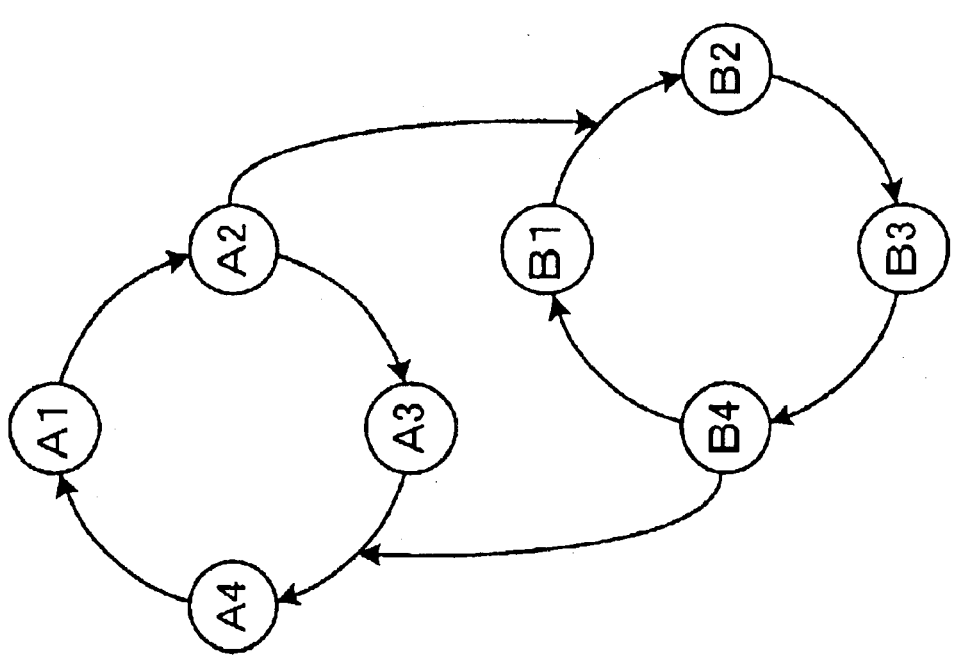

Here, a state transition in the case of combining a plurality of Johnson counters is described. FIGS. 5A and 5B are diagrams showing an exemplary state transition when two Johnson counters are combined. For example, in the case that the Johnson counters JC1, JC2 shown in FIG. 4 undergo a state transition of A1→A2→A3→A4 and a state transition of B1→B2→B3→B4, respectively, a state transition shown in FIG. 5A can be realized by combining the state transitions of the two Johnson counters JC1, JC2.

Specifically, the state A2 of the Johnson counter JC1 kicks the Johnson counter JC2 to transition to the state B2 by using the decoded output of the state A2 of the Johnson counter JC1 as a stop-motion control signal for the state B2 of the Johnson counter JC2. The state B4 of the Johnson counter JC2 kicks the Johnson counter JC1 to transition to the state A4 by using the decoded output of the state B4 of the Johnson counter JC2 as a stop-motion control signal for the state A4 of the Johnson counter JC1. Finally, a state transition shown in FIG. 5B can be realized.

In this way, by using the decoded output of a certain Johnson counter as a stop-motion control signal for the other Johnson counter by means of the Johnson counter part 1 and the routing part 2, a specified state of this certain Johnson counter can be transitioned to a desired state of an other Johnson counter. Thus, a desired state transition can be realized by combining a plurality of Johnson counters.

Referring back to FIG. 4, the data path part 3 is constructed by various logic circuits and the like, applies various processing based on the decoded outputs D1 to D4, using the decoded outputs D1 to D4 of the Johnson counters JC1 to JC4 as control signals, and outputs data obtained by applying various processings to input data as output data.

By taking the above construction, the data path part 3, for examples, applies a first processing to the input data using the decoded output D1 of the Johnson counter JC1 as a control signal, applies a second processing using the decoded output D2 of the Johnson counter JC2 kicked by the decoded output D1 as a control signal, applies a third processing using the decoded output D3 of the Johnson counter JC3 kicked by the decoded output D1 as a control signal, and applies a fourth processing using the decoded output D4 of the Johnson counter JC4 kicked by the decoded output D2 as a control signal. The data path part 3 can output the data obtained after the first to fourth processings as an output data.

As described above, a desired state transition is created by combining the transition states of a plurality of Johnson counters constructed by the Johnson counter part 1 by means of the routing part 2, and desired processings can be applied in the data path part 3 based on the created desired state transition.

Although four Johnson counters are used in this embodiment, the number of Johnson counters constructed by the Johnson counter part 1 is not particularly limited to this example. A different number of Johnson counters may be constructed. Further, the kicking relationship between the Johnson counters is not particularly limited to the above example, and various changes can be made therein. Similar to the first embodiment, the variable circuit of this embodiment may be also realized by an FPGA and the like.

This application is based on patent application No. 2002-46735 filed in Japan, the contents of which are hereby incorporated by references.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds are therefore intended to embraced by the claims.

What is claimed is:

1. A variable circuit for changing a circuit configuration by changing connected states of a plurality of flipflops, wherein the plurality of flipflops are arranged in a first and a second rows, and in the case that the flipflops in the first and second rows are alternately arranged, an input side of each flipflop arranged in the first row has a connection selected from a twisted connection with an output side thereof, a straight connection with an output side of the flipflop provided before this flipflop in the first row, and twisted connections with output sides of two flipflops arranged in the second row and adjacent to this flipflop, and an input side of each flipflop arranged in the second row has a connection selected from a twisted connection with an output side thereof, a straight connection with an output side of the flipflop provided before this flipflop in the second row, and straight connections with output sides of two flipflops arranged in the first row and adjacent to this flipflop.

2. A variable circuit according to claim 1, wherein Johnson counters constructed by the plurality of flipflops include a Johnson counter provided with a stop-motion control for stopping the state transition thereof.

3. A variable circuit according to claim 2, wherein the Johnson counters provided with the stop-motion control includes a first Johnson counter and a second Johnson counter, and a decoded output of the first Johnson counter is used as a stop-motion control signal for controlling the stop motion of the second Johnson counter.

4. A variable circuit according to claim 3, further comprising a routing circuit transmitting the decoded output of the first Johnson counter to the second Johnson counter as the stop-motion control signal.

5. A variable circuit according to claim 4, further comprising a data path circuit constructed by prescribed logic circuits and executing a prescribed processing based on the decoded output.

6. A variable circuit according to claim 5, wherein the routing circuit includes a space switch.

7. A variable circuit according to claim 1, wherein the plurality of flipflops include a plurality of JK flipflops.

8. A variable circuit according to claim 7, wherein the plurality of JK flipflops are constructed by a field programmable gate array.

9. A variable circuit according to claim 1, wherein the flipflops arranged in the first row are coupled to a plurality of first connection circuits connecting the input side of the flipflops arranged in the first row to one of the inverted output sides thereof, the output side of the flipflop provided before this flipflop in the first row, and the inverted output sides of two flipflops arranged in the second row and adjacent to this flipflop, and the flipflops arranged in the second row are coupled to a plurality of second connection circuits connecting the input sides of the flipflops arranged in the second row to one of the inverted output sides thereof, the output sides of the flipflop provided before the flipflop in the second row, and the output sides of two flipflops arranged in the first row and adjacent to this flipflop.

* * * * *